US006028761A

United States Patent [19]

Cooter

[11] Patent Number: 6,028,761

[45] Date of Patent: Feb. 22, 2000

[54] APPARATUS AND METHOD FOR MONITORING, CONTROLLING, DISPLAYING AND DISSIPATING AN ELECTROSTATIC CHARGE

[75] Inventor: Steve R. Cooter, Colorado City, Colo.

[73] Assignee: C-Technologies LLC, Colorado Springs, Colo.

[21] Appl. No.: 09/033,656

[22] Filed: Mar. 3, 1998

Related U.S. Application Data

[60] Provisional application No. 60/040,025, Mar. 4, 1997.

[51] Int. Cl.[7] .......... H03F 3/02

[52] U.S. Cl. .......... 361/212; 361/220; 340/649

[58] Field of Search .......... 361/212, 224, 361/225, 107, 111; 307/91; 340/649, 662, 635; 174/53, 65 R; 324/109, 464

[56] References Cited

U.S. PATENT DOCUMENTS

| | | | |
|---|---|---|---|
| 5,179,739 | 1/1993 | Horiguchi | 361/220 |
| 5,359,319 | 10/1994 | Campbell et al. | 340/649 |
| 5,406,443 | 4/1995 | Cooter et al. | 361/221 |
| 5,408,186 | 4/1995 | Bakhoum | 324/509 |
| 5,450,277 | 9/1995 | Wescott et al. | 361/220 |
| 5,461,369 | 10/1995 | Campbell et al. | 340/649 |
| 5,691,875 | 11/1997 | Dangelmayer et al. | 361/222 |
| 5,768,086 | 6/1998 | Abe | 361/212 |

*Primary Examiner*—Jeffrey Gaffin
*Assistant Examiner*—Kim Huynh
*Attorney, Agent, or Firm*—Pennie & Edmonds LLP

[57] ABSTRACT

An apparatus and method for monitoring, controlling, displaying, and dissipating an electrostatic charge from an object such as a computer monitor, television, workbench, telephone handset or person. An electrostatic charge is electrically coupled to an input terminal of an electrostatic dissipater. The electrostatic dissipater includes a "hardening" circuit, such as a voltage-overload circuit, which serves to protect the components of the electrostatic dissipater itself. As the electrostatic charge is dissipated, a display indicates the level of electrostatic charge being dissipated. This indication permits trouble-shooting electrostatic charge problem areas as well as increasing user awareness of electrostatic problems. A conductive electrostatic solution used in conjunction with the electrostatic dissipater improves dissipation of the electrostatic charge. Similarly, the electrostatic dissipater improves the efficiency of a conductive electrostatic solution.

85 Claims, 13 Drawing Sheets

APPARATUS AND METHOD FOR MONITORING, CONTROLLING, DISPLAYING AND DISSIPATING AN ELECTROSTATIC CHARGE

RELATED APPLICATIONS

This application claims the benefit of U.S. Provisional Application 60/040,025, filed Mar. 4, 1997, entitled APPARATUS AND METHOD FOR MONITORING, CONTROLLING, DISPLAYING AND DISSIPATING AN ELECTROSTATIC CHARGE, which is incorporated by reference herein.

BACKGROUND OF THE INVENTION

1. Field of the Invention

The present invention relates to an apparatus and method for monitoring, controlling, displaying and dissipating an electrostatic charge from an object, such as a computer monitor, television, telephone handset or workbench.

2. Description of the Related Art

There are several problems created by the accumulation of electrostatic charge on an object such as damage to sensitive electrical devices that occurs during an electrostatic discharge event. An electrostatic charge is typically generated by people in two ways, triboelectrification and induction. Triboelectrification is caused by contact and separation between two similar or dissimilar materials. For example, when a person walks across the room, each shoe repeatedly comes in and out of contact with the floor surface, such as carpet. This causes the generation and accumulation of electrostatic charge on the person through triboelectrification. Triboelectrification also occurs in devices. For example, a belt being pulled over a pulley is constantly coming in and out of contact with the pulley which generates electrostatic charge through triboelectrification.

Another way an electrostatic charge is generated or accumulated on a person is by induction. By induction, an electrostatic charge on one object is induced to another object having a lower electrostatic potential. For example, a conveyor belt running near a person would accumulate an electrostatic charge. This electrostatic charge is induced to the person near the belt where that person is typically at a lower electrostatic potential than the charge on the belt. Electrostatic induction similarly occurs to a person sitting near a cathode ray tube ("CRT") of a computer monitor or television screen. The CRT is constantly generating a large amount of positive charge, while the person near the CRT typically has a negative charge. Therefore, an electrostatic charge is induced from the CRT to the person.

The above two methods are the most common methods that electrostatic charge is induced on an object or person. These two methods of generating electrostatic charge lead to at least three failure modes in electronic equipment: catastrophic electrostatic failure, latent electrostatic failure, and irradiated electrostatic failure.

A catastrophic electrostatic failure occurs where the electrostatic charge of an electrostatic event destroys the non-conductive oxide layer of integrated circuits, surface mount resisters, and other sensitive electronic components. Catastrophic electrostatic failure usually results in immediate, irreparable damage to the electrical component.

Latent electrostatic failure is probably the most common failure mode caused by electrostatic charge. In latent electrostatic failure, accumulated electrostatic charge weakens the non-conductive oxide layer of sensitive electronic components. This weakening of an electronic component leads to intermittent problems where sometimes the component works and sometimes the component does not work. Such intermittent problems are probably the most difficult problems to trace.

Irradiated electrostatic failure is probably the least common failure mode. In an irradiated electrostatic failure, an electrostatic event occurs near a sensitive electronic component. The sensitive electronic component, such as a microprocessor, interprets the electrostatic event as a command which ultimately causes a system glitch. Irradiated electrostatic failure can also corrupt software stored on electromagnetic media such as floppy disks or hard disks.

With telephone handsets and headsets, the electrostatic problem typically arises from triboelectrification where electrostatic charge is generated by the person using the handset/headset walking or pacing. With tele-marketers, the electrostatic charge is typically induced into the user of the handset/headset when the user touches or is near a computer screen. The electrostatic charge causes a distinct crackle sound in the receiver of the handset/headset. A painful electrostatic event may also occur between the user's ear and the handset/headset. With repeated accumulation and discharge of electrostatic charge, the handset/headset is eventually damaged and must be replaced.

A number of electrostatic dissipaters have been developed to address the problems created by electrostatic charge. For example, Cooter, et al., U.S. Pat. No. 5,406,443, concerns a static electricity dissipation system for computers. Alm, U.S. Pat. No. 5,357,396, concerns an earth discharge carrier intended to dampen and discharge electrostatic fields from a monitor or keyboard. Wescott, et al., U.S. Pat. No. 5,450,277, concerns an electrostatic discharge device to discharge electrostatic energy from a computer operator or optical element such as a filter mounted on a CRT computer monitor.

However, these and other conventional techniques for dissipating an electrostatic charge are themselves susceptible to damage from the electrostatic charge. For example, through time, repeated conduction by a resistor of an electrostatic charge, and particularly the initial electrostatic event, deteriorates the performance of the resistor, whether the resistor is part of the object to be protected or part of the electrostatic dissipater itself. This is because the electrostatic charge weakens and eventually destroys the non-conductive oxide layers of a resistor which are interposed between the conductive layers of the resistor. Indeed, the non-conductive oxide layers of surface mount resistors are relatively thin and particular susceptible to an electrostatic charge and, hence, surface mount resistors are not conventionally used to miniaturize electrostatic dissipating devices.

Further, means for displaying the electrostatic charge being dissipated were limited because the electrostatic charge, and particularly the initial electrostatic event, would damage the display device. For example, repeated exposure to electrostatic charge causes a liquid crystal display ("LCD") to have darkened areas as the LCD is gradually damaged by electrostatic charge.

SUMMARY OF THE INVENTION

It is an object of the present invention to provide an electrostatic dissipater with a longer operable life than conventional electrostatic dissipaters.

It is a further object of the present invention to provide an electrostatic dissipater that is smaller in size than conventional electrostatic dissipaters.

It is yet another object of the present invention to provide an electrostatic dissipater with a display to indicate the level of electrostatic charge being discharged.

It is another object of the present invention to prolong the effectiveness of electrostatic solutions.

The present invention relates to an apparatus for monitoring, controlling, displaying and dissipating an electrostatic charge from an object such as a computer monitor, television screen, telephone handset, workbench or person. An apparatus in accordance with this invention conducts an electrostatic charge from an object and into a ground reference, operating to either continuously dissipate the electrostatic charge (e.g., if the apparatus is continuously electrically coupled to the object), or intermittently dissipate the electrostatic charge (e.g., if the apparatus is intermittently electrically coupled to the object). The apparatus minimizes the effect that an electrostatic event would otherwise have on the object by constantly dissipating the electrostatic charge to prevent the accumulation of an electrostatic charge, thereby reducing the probability of having an electrostatic event, as well as controlling the dissipation of any electrostatic event occurring because of an accumulated charge. As the electrostatic charge is dissipated, the level of electrostatic charge is indicated on a display. This display permits monitoring of electrostatic activity with respect to the object which is useful in assessing electrostatic problem areas and increasing user awareness of electrostatic problems.

Generally, an apparatus according to this invention conducts an electrostatic charge from an object into a conductive or semi-conductive housing of the electrostatic device. The electrostatic charge is then dissipated to a reference ground through a voltage-overload or "hardening" circuit and a bank of resistors. Additionally, the level of electrostatic charge being dissipated is displayed on a liquid crystal display ("LCD").

In one embodiment of the invention, a stand-alone electrostatic dissipater provides a portable means of monitoring, controlling, dissipating and displaying an electrostatic charge from an object. The stand-alone electrostatic dissipater may be fastened to an object serving as a reference ground. An electrostatic charge is dissipated from another object by electrically coupling the object to either the housing or input/output jack of the stand-alone electrostatic dissipater. The basic structure of the stand-alone electrostatic dissipater has a conductive or semi-conductive housing enclosing a liquid crystal display ("LCD") assembly and circuit board assembly which are electrically insulated from the housing. The output ground terminal of the circuit board assembly is electrically coupled to an object serving as a reference ground through a ground wire and conductive foam pad, the conductive foam pad being in physical contact with the reference ground object. The stand-alone electrostatic dissipater is attached to the reference ground object using an electrically insulated material such as Velcro or a non-conductive magnet. An electrostatic charge may be discharged from another object, such as a person, by placing the object near the housing or placing the object in physical contact with the housing. The electrostatic charge is dissipated to the ground wire through a bank of resistors and a hardening circuit (e.g., a neon gas lamp) of the circuit board assembly.

In another embodiment of the invention, a retrofit electrostatic dissipater is fastened to the housing of a computer monitor or television for monitoring, controlling, displaying, and dissipating an electrostatic charge from the computer monitor or television screen. An electrostatic charge on the computer monitor is dissipated by electrically coupling the surface of the computer monitor to the housing or input/output jack of the retrofit electrostatic dissipater. The electrostatic charge is then conducted to a reference ground electrically coupled to the input/output jack. The structure of the retrofit electrostatic dissipater is similar to the stand-alone electrostatic dissipater. However, the retrofit electrostatic dissipater does not have a ground wire and conductive foam pad to electrically couple the output ground terminal to a reference ground. Rather, the retrofit electrostatic dissipater has a ground wire electrically coupled to the output ground terminal of the circuit board assembly through the input/output jack. Further, the retrofit electrostatic dissipater is attached to the computer monitor using an adhesive, the adhesive preferably being conductive or semi-conductive in order to enhance conduction of the electrostatic charge on the computer monitor to the housing of the retrofit electrostatic dissipater.

In another embodiment of the invention, an original equipment manufacture ("OEM") electrostatic dissipater is built-in to a computer monitor or television. An electrostatic charge on the surface of the computer monitor is dissipated by electrically coupling the computer monitor housing and screen to the housing or input/output jack of the OEM electrostatic dissipater, and conducting the electrostatic charge to a reference ground such as the computer monitor ground. The structure of the OEM electrostatic dissipater is similar to that of the retrofit electrostatic dissipater. However, the OEM electrostatic dissipater has a ground wire electrically coupled to the output ground terminal of the circuit board assembly and to the computer monitor ground which serves as a reference ground.

In another embodiment of the invention, a conductive electrostatic solution is applied to the surface of the housing and screen of a computer monitor or television, and an electrostatic charge is dissipated from the computer monitor through an electrostatic dissipater such as a retrofit electrostatic dissipater or an OEM electrostatic dissipater.

In another embodiment of the invention, an input/output jack of an electrostatic dissipater attached to a computer monitor (e.g., retrofit electrostatic dissipater or OEM electrostatic dissipater) permits dissipating an electrostatic charge from an external object such as a computer keyboard, mouse, palm rest or computer operator.

In another embodiment of the invention, a workbench electrostatic dissipater is attached to a conductive mat of an electronic workbench. An electrostatic charge is conducted to the housing or input/output jack of the workbench electrostatic dissipater, and conducted to an reference ground. The structure of the workbench electrostatic dissipater is similar to that of the retrofit electrostatic dissipater.

In another embodiment of the invention, a telephone electrostatic dissipater is electrically coupled to a telephone handset or headset. An electrostatic charge is conducted from the handset or headset through the telephone cord which is coated with a conductive solution, and to the input/output jack of the telephone electrostatic dissipater. The electrostatic charge is then conducted to a ground reference which is electrically coupled to the input/output jack. The structure of the telephone electrostatic dissipater is similar to that of the retrofit electrostatic dissipater.

The embodiments according to the present invention provide several advantages over prior techniques of controlling the accumulation and discharge electrostatic charge. For example, prior techniques do not protect the electrostatic dissipating circuit itself, such that resisters and other electrical components of the circuit would become inoperable over time. The "hardening" circuit of the present invention prolongs the operable life of the electrostatic dissipater.

Known apparatus' either do not provide a visual display of the electrostatic charge being dissipated at all, or only provide a display of whether an electrostatic charge is being dissipated without indicating the level of the electrostatic charge being dissipated. However, in the present invention, the display indicates not only whether an electrostatic charge is being dissipated, but the level of electrostatic charge being dissipated which improves monitoring and addressing problem areas associated with electrostatic charge.

DETAILED DESCRIPTION OF THE PRESENTLY PREFERRED EXEMPLARY EMBODIMENT

1. Stand-Alone Electrostatic Dissipater

Figure 1:
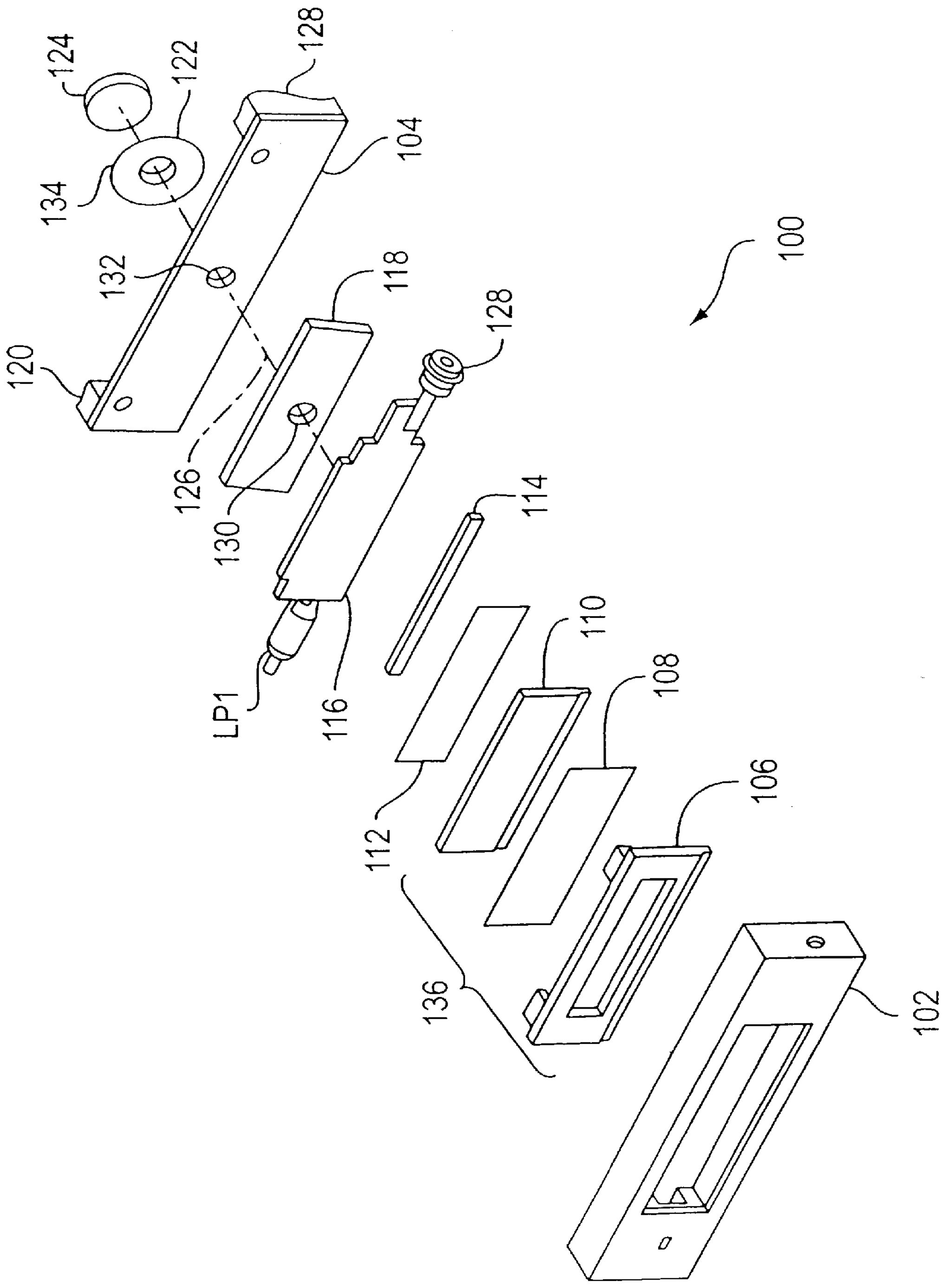
FIG. 1 is a diagram showing one embodiment of a stand-alone electrostatic dissipater in accordance with the present invention.

As shown in FIG. 1, a preferred embodiment of a stand-alone electrostatic dissipater in accordance with the present invention is designated generally by the reference character 100. As shown, the stand-alone electrostatic dissipater 100 includes a front housing cover 102 and rear housing cover 104. An LCD assembly 136 includes an insulated LCD housing 106, an LCD protective lens 108, and an LCD 110. An insulator 112 electrically insulates the LCD assembly 136 from the circuit board assembly 116. A connector 114 electrically couples the LCD assembly to the circuit board assembly 116. An insulative compression pad 118 electrically insulates the circuit board assembly 116 from the rear housing 104. A ground wire 126 is electrically coupled to the circuit board assembly 116 and to a conductive foam pad 124, with the ground wire 126 positioned through an aperture 130 of the insulative compression pad 118, an aperture 132 of the rear housing 104, and an aperture 134 of an insulative shim 122. The insulative shim 122 electrically insulates the conductive foam pad 124 from the rear housing cover 104.

Fasteners 120 and 128 are attached to the back of the rear housing cover 104. The fasteners 120 and 128 may be used to attach the stand-alone electrostatic dissipater 100 to an object. These fasteners may be Velcro, insulated magnets, or other non-conductive fastening material. The width of the fasteners 120 and 128, the insulative shim 122, and the conductive foam pad 124 are set such that the fasteners 120 and 128 and conductive foam pad 124 will lie flush with an object to which the electrostatic dissipater 100 is attached. For example, the widths of 0.125, 0.005, and 0.120 inches may be used for the fasteners 120 and 128, insulative shim 122 and conductive foam pad 124, respectively.

The front housing cover 102 and rear housing cover 104 are made of conductive or semi-conductive materials. For example, the housing cover 102 and rear housing cover 104 may be made of a conductive plastic made with a conductive filler such as carbon, stainless steel or other type of conductive material. A carbon filler is less expensive than other conductive fillers, but a stainless steel filler is a cleaner filler for clean room purposes since contact with the material does not leave a dark mark as is usually left when a carbon filler is used. Further, the filler may be either fiber or powder, where a fiber filler provides a stronger housing, but a powder filler is less expensive. The surface resistivity of a housing made with a conductive filler can be better controlled than when the housing is merely coated with a conductive electrostatic chemical. Preferably, the surface resistivity of the front housing cover 102 and rear housing cover 104 is $10^{-4}\ \Omega^2$. This permits the front housing cover 102 and rear housing cover 104 to be used as part of the resistive dissipating elements of the electrostatic dissipator, as well as contributing to "hardening" of the circuit, as discussed later.

An electrostatic charge on an object is electrically coupled to the circuit board assembly 116 through the front housing cover 102 or rear housing cover 104 by, for example, placing the object in contact with or near the front housing cover 102. Further, an electrostatic charge on an object may be electrically coupled to the circuit board assembly 166 through an input/output jack 128.

An electrostatic charge is conducted from the front rear housing cover 102 and rear housing cover 104 to the circuit board assembly 116 through an electrical contact (not shown) such as a metal spring. The circuit board assembly 116 is otherwise electrically insulated from the front housing cover 102 and rear housing cover 104 by the insulative compression pad 118, insulator 112, and insulated LCD housing 106. The circuit board assembly 116 monitors and controls dissipation of the electrostatic charge and conducts the charge to an object serving as a reference ground through ground wire 126 and conductive foam pad 124 which is placed in contact with the reference ground. The conductive foam pad 124 is electrically insulated from the rear housing cover 104 by the insulative shim 122. The ground wire 126 is coated with a non-conductive material to electrically insulate the ground wire 126 from the aperture 132 and rear housing cover 104. Further, the rear housing cover 104 is electrically insulated from the reference ground by fasteners 120 and 122.

In conjunction with monitoring and controlling dissipation of the electrostatic charge, the circuit board assembly 116 supplies a display signal to the LCD assembly 136 through the connector 114. The LCD assembly 136 is otherwise electrically insulated from the circuit board assembly 116 by the insulator 112. The LCD assembly 136 is also electrically insulated from the front housing cover 102 by the insulated LCD housing 106. An LCD protective lens 108 lies between the insulated LCD housing 106 and the LCD 110.

Figure 2:
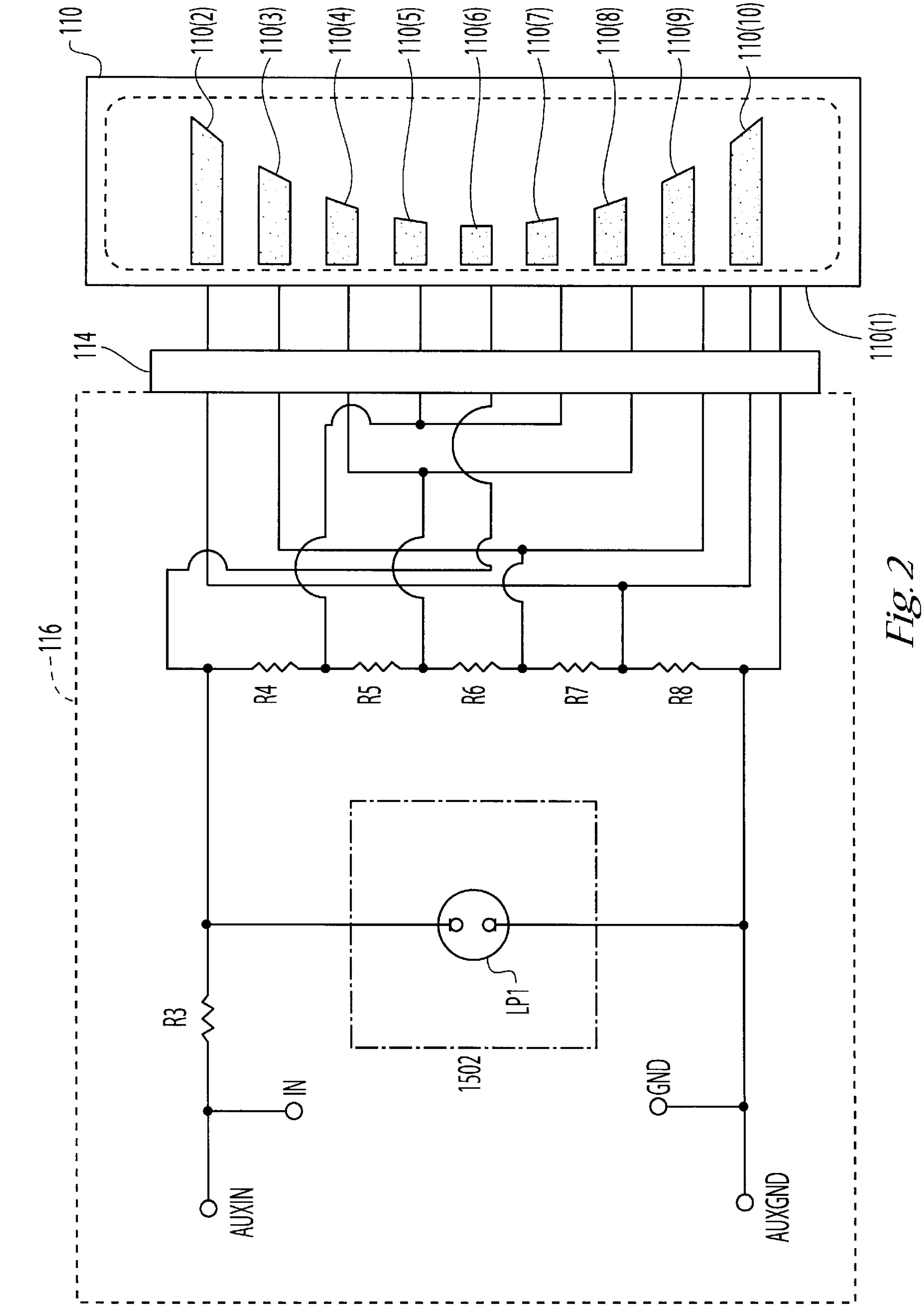
FIG. 2 is an electrical schematic showing one embodiment of an electrical circuit of a stand-alone electrostatic dissipater in accordance with the present invention.

As shown in FIG. 2, a preferred embodiment of the electrical circuit of the circuit board assembly 116 in accordance with the present invention is designated generally by the reference character 116. An electrostatic charge is conducted to the circuit board assembly 116 through a terminal AUXIN or a terminal IN. The terminal AUXIN is electrically coupled to an INPUT terminal (not shown) of the input/output jack 128, and the terminal IN is electrically coupled to the front housing cover 102 and rear housing cover 104. The electrostatic charge is ultimately conducted from the circuit board assembly 116 to a reference ground through a terminal AUXGND or a terminal GND. The terminal AUXGND is electrically coupled to the OUTPUT terminal (not shown) of the input/output jack 128, and the terminal GND is electrically coupled to the ground wire 126.

The electrostatic charge at terminal AUXIN or terminal IN is initially conducted through resistor R3. The electrostatic charge is then conducted to the terminal GND and terminal AUXGND through a voltage overload circuit 150, resistors R4–R8, and LCD 110.

The voltage overload circuit 150 serves as a "hardening" circuit, and includes a neon gas lamp LP1. The neon gas lamp LP1 serves to dissipate the high voltage initial spike associated with the first portion of an electrostatic event, dissipating the initial spike to ground and protecting the other components of an electrostatic dissipater. For example, when the potential of an electrostatic event exceeds the activation threshold of the neon gas lamp LP1, for example 500 volts, as is usually the case with the initial portion of an electrostatic event, the electrostatic charge is dissipated through the neon gas lamp LP1 and bypasses the resistors R4–R8 and LCD 110. While conducting the electrostatic charge, the neon gas lamp LP1 also dissipates the electrostatic charge which helps protect resistor R3. As the potential of the electrostatic charge falls below the activation threshold of the neon gas lamp LP1, for example 500 volts, the electrostatic charge is dissipated through the resistors R4–R8 and LCD 110. As a result, the voltage overload circuit 150 functions to "harden" the circuit board assembly 116 by protecting the other components from the damaging initial spike that occurs during an electrostatic event. The semi-conductive or conductive front housing cover 102 and rear housing cover 104 also help dissipate the electrostatic charge to further "harden" the device where the electrostatic charge is electrically conducted to the circuit board assembly 116 through the front housing cover 102 or rear housing cover 104.

Due to the protection provided by the voltage overload circuit 150, resistors R3–R8 may be surface mount resistors rather than the larger, bulkier resistors conventionally used for electrostatic dissipating devices. Resistors are made of layers non-conductive oxide layers and conductive layers. With surface mount resistors, the non-conductive oxide layers are much thinner than the non-conductive oxide layers of the larger, conventional resistors. Therefore, the surface mount resistors are more susceptible to damage to the thin non-conductive layers by the initial electrostatic spike that occurs with an electrostatic event. By providing the voltage overload protection circuit to dissipate the initial electrostatic event, the electrostatic dissipator may be made with surface mount resistors. Otherwise, without the voltage overload protection circuit, larger resistors would be required to prolong the operable life of the electrostatic dissipater because the larger resistors have thicker non-conductive oxide layers which are less susceptible to electrostatic charge. This results in the ability to reduce the size of the circuit board assembly 116, as well as reducing the overall size of the stand-alone electrostatic dissipater 100.

Further, the voltage overload circuit 150 permits the use of a standard LCD for the LCD 110, and prolongs the life of the LCD 110 which would otherwise blacken and burn-out due to repeated exposure to the damaging initial spike of an electrostatic event.

The bank of resistors R3–R8 serve to slow and manipulate the electrostatic charge to ground. Using a bank of resistors rather than one or two resistors permits using physically smaller resistors, such as surface mount resistors. Further, the voltage across respective resistors R4–R8 are conducted to LCD 110 through the connector 114 to indicate the level of electrostatic charge being dissipated. The values of the resistors R4–R8 are selected such that respective LCD elements 110(2)–110(10) of the LCD 110 indicate a specific level of electrostatic charge being dissipated. For example, in the embodiment shown in FIG. 2, resistors R3–R6 are each 2.2 MΩ and resistors R7–R8 are each 1 MΩ, which permits respective LCD elements 110(2)–110(10) of the LCD 110 to indicate electrostatic discharge levels of 500 V, 2.5 kV, 5 kV 7.5 kV and 10 kV, as described below.

A signal indicating the level of electrostatic discharge is output to LCD 110 through connector 114 as follows: the voltage between resistors R3 and R4 is input to LCD element 110(6); the voltage between resistors R4 and R5 is input to LCD elements 110(5) and 110(7); the voltage between resistors R5 and R6 in input to LCD elements 110(4) and 110(8); the voltage between resistors R6 and R7 is input to LCD elements 110(3) and 110(9); the voltage between resistors R7 and R8 is input to LCD elements 110(2) and 110(10); and the voltage at terminal GND is input to LCD ground 110(1). This configuration results in the LCD 110 displaying the level of electrostatic discharge as shown in TABLE 1 below and as described as follows: activating LCD element 110(6) if the electrostatic discharge reaches some minimum level, for example, 500 V; activating LCD elements 110(5) through 110(7) if the electrostatic discharge reaches a second level, for example 2.5 kV; activating LCD elements 110(4) through 110(8) if the electrostatic discharge reaches a third level, for example 5 kV; activating LCD elements 110(3) through 110(9) if the electrostatic discharge reaches a fourth level, for example 7.5 kV; and activating LCD elements 110(2) through 110(10) if the electrostatic discharge reaches a fifth level, for example 10 kV.

TABLE 1

| Level | LCD Element - X Denotes Element is Activated | | | | | | | | |
|---|---|---|---|---|---|---|---|---|---|
| of Charge | 110 (2) | 110 (3) | 110 (4) | 110 (5) | 110 (6) | 110 (7) | 110 (8) | 110 (9) | 110 (10) |
| 500V | | | | | X | | | | |
| 2.5 kV | | | | X | X | X | | | |
| 5 kV | | | X | X | X | X | X | | |
| 7.5 kV | | X | X | X | X | X | X | X | |
| 10 kV | X | X | X | X | X | X | X | X | X |

The values of the resistors R3–R8 may be adjusted to permit indication of various expected levels of electrostatic discharge. Further, variable resistors may be inserted for each of the resistors R4–R8 in order to variably adjust the level of electrostatic discharge displayed at LCD 110. As the resistance level of a particular resistor R4–R8 is lowered, a higher voltage level of electrostatic charge is required in order to activate the respective LCD element associated with that resistor. Although using the variable resistors may increase the size of the electrostatic device, such variable resistors add the benefit of being able to isolate and detect specific electrostatic charge problems at specific levels. For example, detecting specific levels of electrostatic charge may be of particular concern to manufacturing facilities that have specific electrostatic requirements (such as, a manufacturing facility specification that prohibits having an electrostatic charge over 50 volts).

Further, using additional resistors in the resistor bank and additional LCD elements in LCD 110 will increase the resolution of the level of electrostatic charge that may be displayed by LCD 110.

The LCD 110 may be monochrome or color. The LCD 110 may display the level of electrostatic charge using a different configuration of LCD elements, such as using LCD elements in a single column or single row. In applications of the invention where only the presence, and not the particular level, of electrostatic charge desired, a single LCD element may be used. Further, the LCD 110 may be the type that has a back-light or the type that merely relies on external light for illumination. The embodiment of the circuit board assembly 116 shown in FIG. 2 uses the dissipated electrostatic charge to power the LCD 110. However, an external power source may also be used if, for example, the particular display used requires additional power.

The input/output jack 128 may be used to input an electrostatic charge to be dissipated and to output the electrostatic charge to the reference ground. The INPUT terminal (e.g., outer portion) of input/output jack 128 is electrically coupled to the front housing cover 102 and to the terminal AUXIN of circuit board assembly 116. The OUTPUT terminal (not shown) of input/output jack 128 is electrically insulated from the front housing cover 102, and is electrically coupled to the terminal AUXGND of the circuit board assembly 116. This provides the stand-alone electrostatic dissipater 100 greater flexibility by permitting input of an electrostatic charge through not only the front housing cover 102, but through the input/output jack 128. Further, an electrostatic charge may be output to a reference ground through either the conductive foam pad 124 placed in electrical contact with a reference ground, such as metal pole, or through the input/output jack 128 electrically coupled to a reference ground.

The above description discusses dissipating an electrostatic charge from an object electrically coupled to the terminals IN or AUXIN to a reference ground electrically coupled to the terminals GND or AUXGND. However, in the embodiment of the present invention as shown in FIG. 2, an electrostatic charge may be dissipated from an object electrically coupled to the terminals GND or AUXGND to a reference ground electrically coupled to the terminals IN or AUXIN.

Preferably, the reference ground used for dissipating the electrostatic charge is a reliable ground of an electrical outlet. However, the reference ground may also be any other suitable ground such as a water pipe, conductive heating duct, or a conductive object large enough to accept the electrostatic charge and gradually dissipate the charge into the air (such as a large metal safe).

2. Retrofit Electrostatic Dissipater

Figure 3:
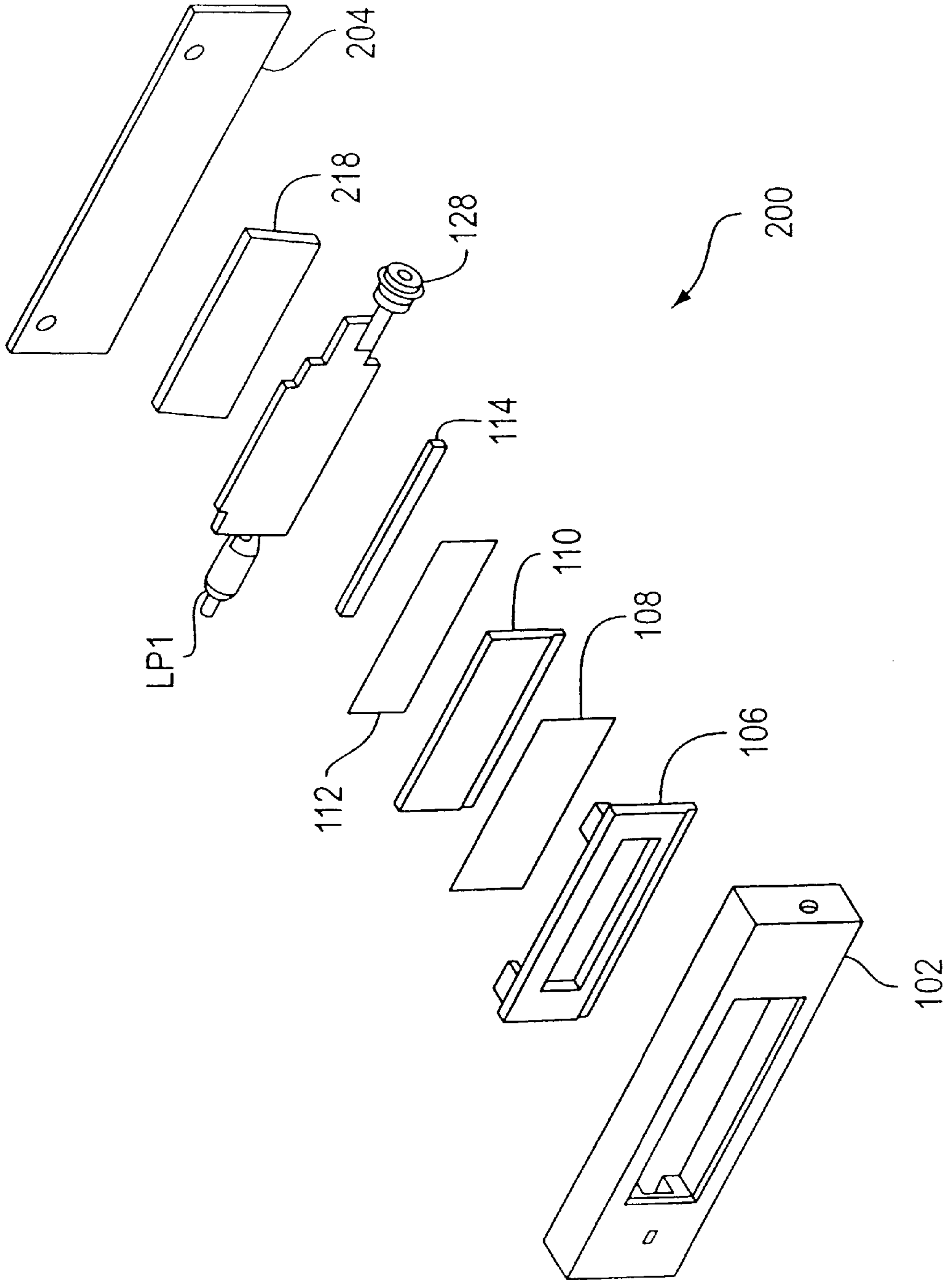
FIG. 3 is a diagram showing one embodiment of a retrofit electrostatic dissipater in accordance with the present invention.
Figure 4:
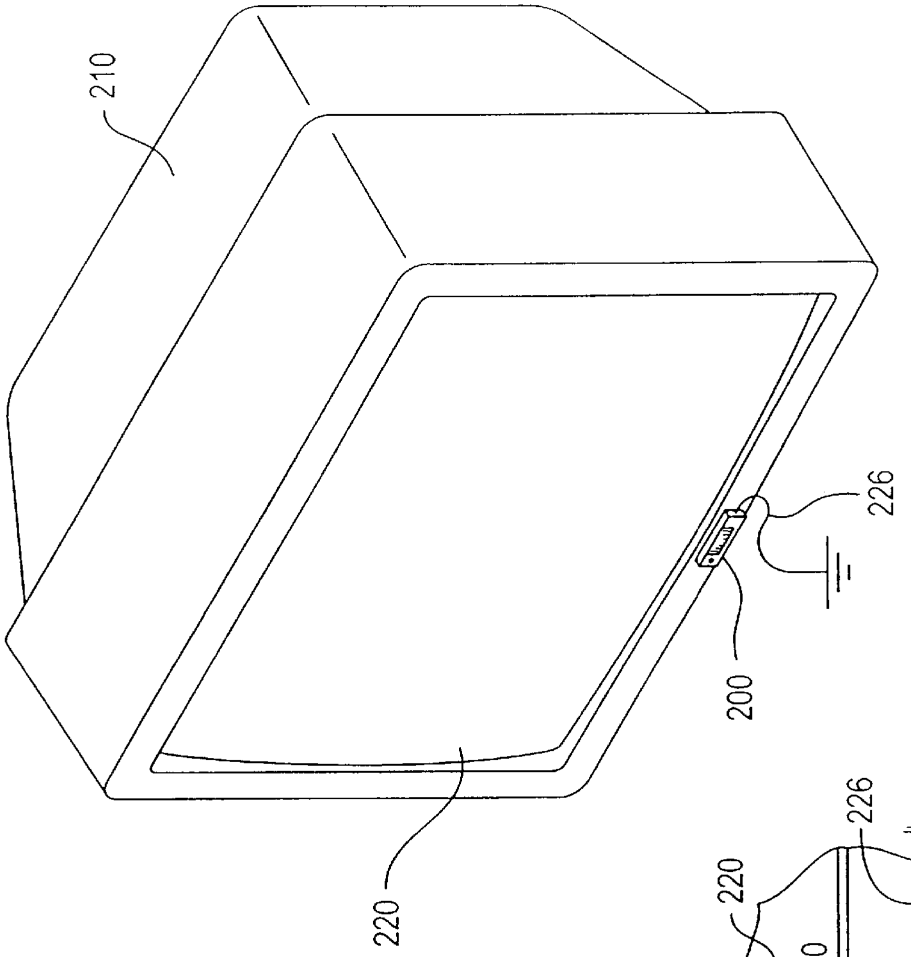
FIG. 4 is a diagram showing one embodiment of the retrofit electrostatic dissipater shown in FIG. 3 fastened to a computer monitor in accordance with the present invention.
Figure 5:
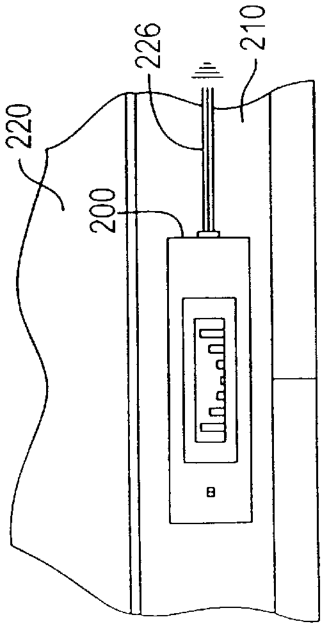
FIG. 5 is a diagram showing a close-up view of a portion of the embodiment shown in FIG. 4.

As shown in FIGS. 3–5, a preferred embodiment of a retrofit electrostatic dissipater for a computer monitor is designated generally by the reference character 200. Elements of FIGS. 3–5 that are the same as those of FIGS. 1–2 are designated by the same reference characters.

The retrofit electrostatic dissipater 200 is similar to the stand-alone electrostatic dissipater 100. The primary difference is that the retrofit electrostatic dissipater does not use the ground wire 126 and conductive foam pad 124 to electrically couple the terminal GND of circuit board assembly 116 to a reference ground to which the conductive foam pad 124 is in contact. As such, the retrofit electrostatic dissipater does not have the ground wire 126, the conductive foam pad 124, the apertures 130 and 132, the insulative shim 122, and the fasteners 120 and 128.

As shown in FIGS. 4 and 5, the retrofit electrostatic dissipater 200 is fastened to the monitor housing 210 using an adhesive, Velcro, other conductive or non-conductive fastening means (not shown). A ground wire 226 is connected to the input/output jack 128 and to a reference ground. An electrostatic charge on the monitor screen 220 is conducted from the monitor screen 220 to the monitor housing 210, to the fastener (not shown), to the rear housing cover 204, and to the terminal AUXIN of the circuit board assembly 116 as shown in FIG. 2. The electrostatic charge is then monitored, controlled, displayed, and dissipated by the circuit board assembly 116 and conducted to the reference ground which is electrically coupled to the AUXGND terminal by the ground wire 226.

Preferably, the monitor housing 210 is made of a conductive material, and the monitor screen 220 is coated with a conductive layer. If the monitor housing 210, monitoring screen 220, or fastener are not conductive, a conductive electrostatic solution may be applied to the surface of the non-conductive or semi-conductive material to improve electrostatic dissipation. Further, using an electrostatic dissipater in conjunction with a conductive electrostatic solution also improves the effectiveness of the conductive electrostatic solution which would otherwise loss its protective properties over time due to prolonged exposure to electrostatic charge that is not immediately dissipated.

It is not necessary to have conductive surfaces because electrostatic charge enters the unit not only through the fastener, but through the air and into the front housing cover 102 and rear housing cover 204. However, it is preferable to have the surfaces of the monitor housing 210, monitor screen 220, and fastener conductive for several reasons. First, conductive surfaces are by their nature more efficient at conducting the electrostatic charge to the retrofit electrostatic dissipater. Further, conductive surfaces will evenly distribute the electrostatic charge across the surface. That is, electrostatic charge on the surface of a non-conductive materiel will accumulate in pockets. As a result, dissipating an electrostatic charge from one portion of a non-conductive surface does not dissipate an electrostatic charge from another portion of the non-conductive surface. As such, multiple points along the non-conductive surface should be electrically coupled to an electrostatic dissipater in order to achieve the same performance if the surface were conductive.

Figure 14:
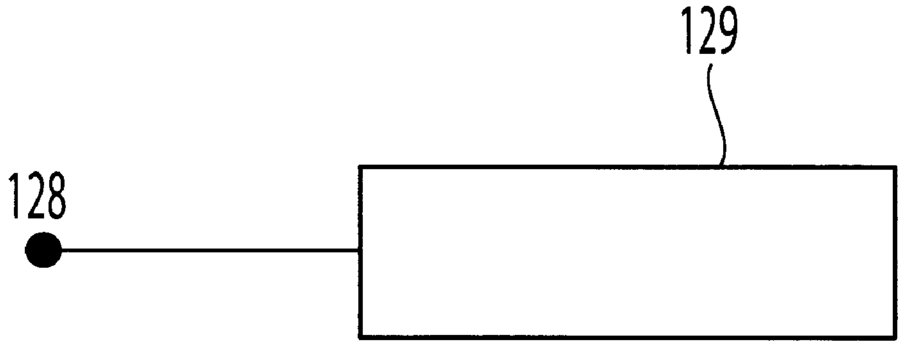
FIG. 14 is a diagram showing how devices may be electrically coupled to the retrofit electrostatic dissipater.
Figure 15:
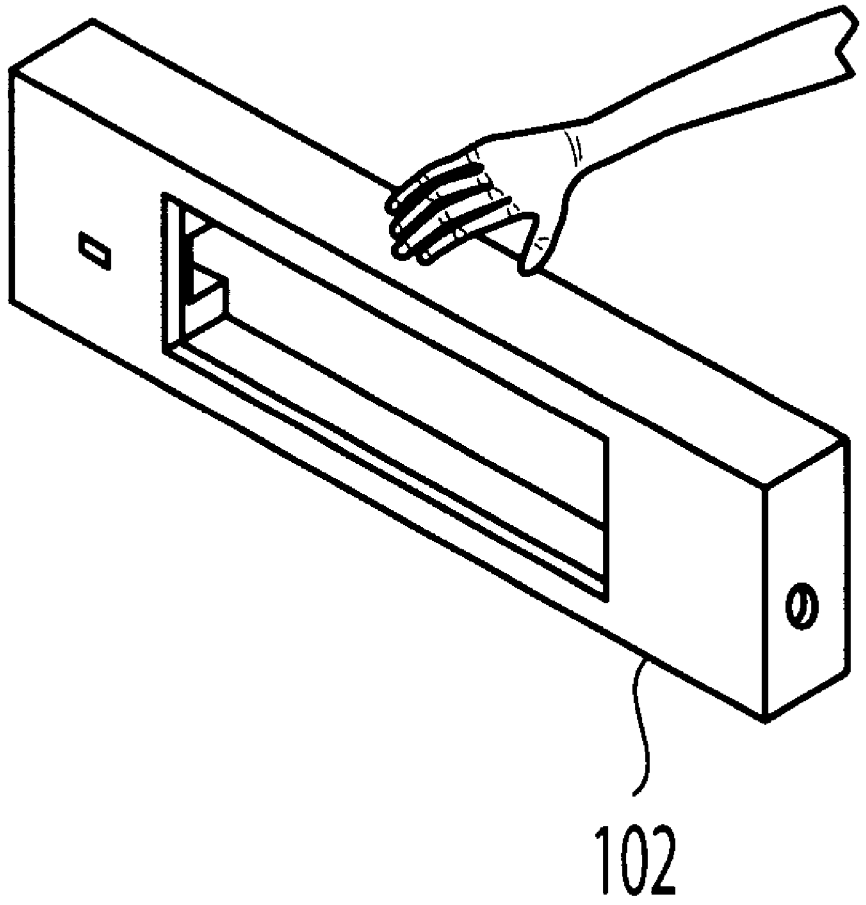
FIG. 15 is a diagram showing how an electrostatic charge may be dissipated from a user touching the front housing cover of the electrostatic dissipater.

In addition to dissipating an electrostatic charge from the computer monitor, another source may be electrically coupled to the INPUT terminal (not shown) of the input/jack 128 for dissipation. For example, as is illustrated in FIG. 14, a mouse, keyboard, palm-rest and other source (collectively, 129) may be electrically coupled to the retrofit electrostatic dissipater 200 through the input/output jack 128. Additionally, as is illustrated in FIG. 15, an electrostatic charge may be dissipated from the user by the user touching the front housing cover 102.

3. OEM Electrostatic Dissipater

Figure 6:
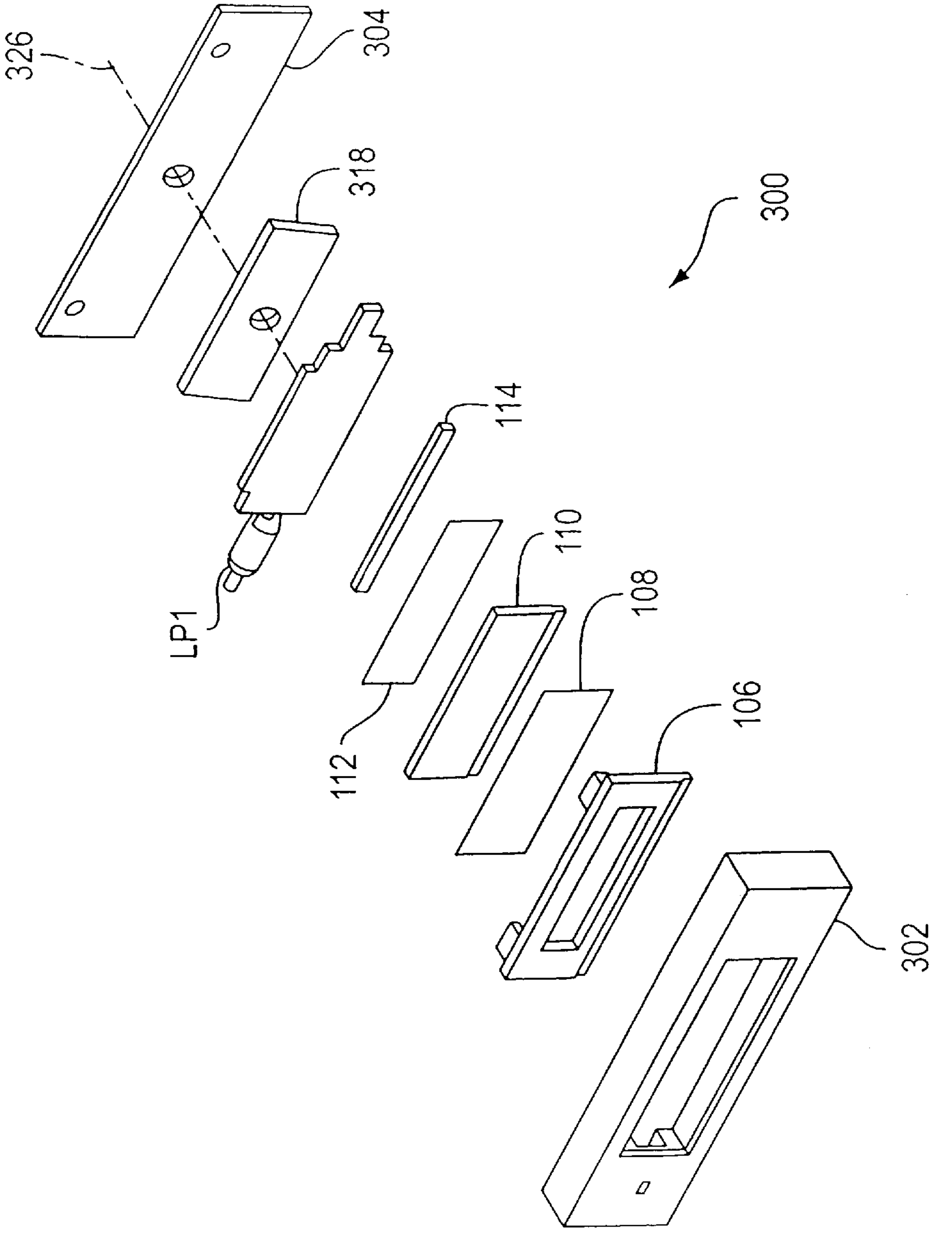
FIG. 6 is a diagram showing one embodiment of an OEM electrostatic dissipater in accordance with the present invention.
Figure 7:
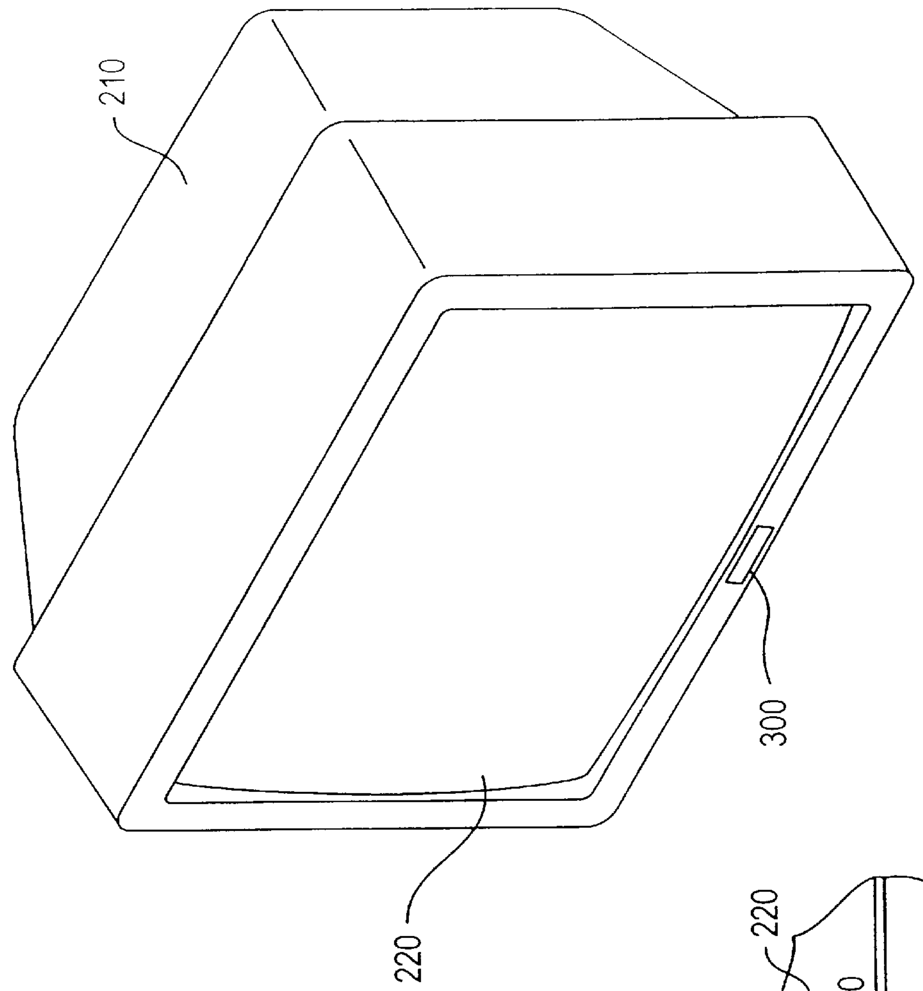
FIG. 7 is a diagram showing one embodiment of the OEM electrostatic dissipater shown in FIG. 6 built-in a computer monitor in accordance with the present invention.
Figure 8:
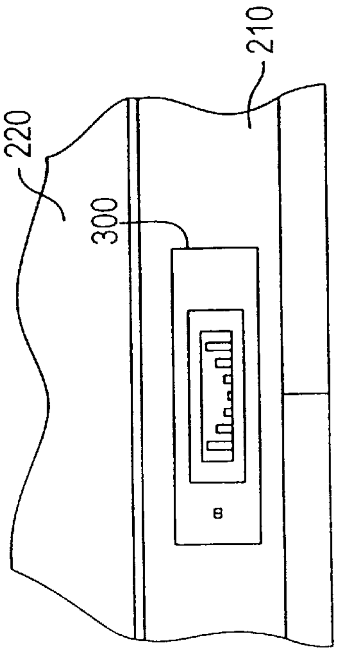
FIG. 8 is a diagram showing a close-up view of a portion of the embodiment shown in FIG. 7.

As shown in FIGS. 6–8, a preferred embodiment of an OEM electrostatic dissipater 300 in accordance with the present invention is designated generally by the reference character 300. Those elements of FIGS. 6–8 that are the same as those of FIGS. 1–5 are designated by the same reference characters.

The OEM electrostatic dissipater 200 is similar to the stand-alone electrostatic dissipater 100. The primary difference is that the OEM electrostatic dissipater does not use the conductive foam pad 124 to electrically couple the terminal GND of circuit board assembly 116 to a reference ground to which the conductive foam pad 124 is in electrical contact. Rather, the ground wire 326 is electrically coupled to the monitor ground. As such, the OEM electrostatic dissipater does not have the conductive foam pad 124, the insulative shim 122, and the fasteners 120 and 128.

Further, the embodiment of the OEM electrostatic dissipater shown in FIG. 6 does not have the input/output jack 128. However, an input/output jack may be used where the input/output jack is accessed from an aperture formed in the front side of the front housing cover 302. Such an embodiment would permit dissipating an electrostatic charge from another object such as a mouse, keyboard, palm-rest or user.

An electrostatic charge from the monitor housing 210 and monitor screen 220 is electrically coupled to the front housing cover 102 through the air and through a fastening means (not shown) used to attach the OEM electrostatic dissipater to the monitor. The electrostatic charge is conducted to the terminal IN of the circuit board assembly 116 where it is dissipated through the voltage over-load circuit 150 and resistors R3–R8, and displayed on LCD 110. The electrostatic charge is conducted from terminal GND to the electrical ground of the monitor which is electrically coupled to the ground wire 126.

4. Workbench Electrostatic Dissipater

Figure 9:
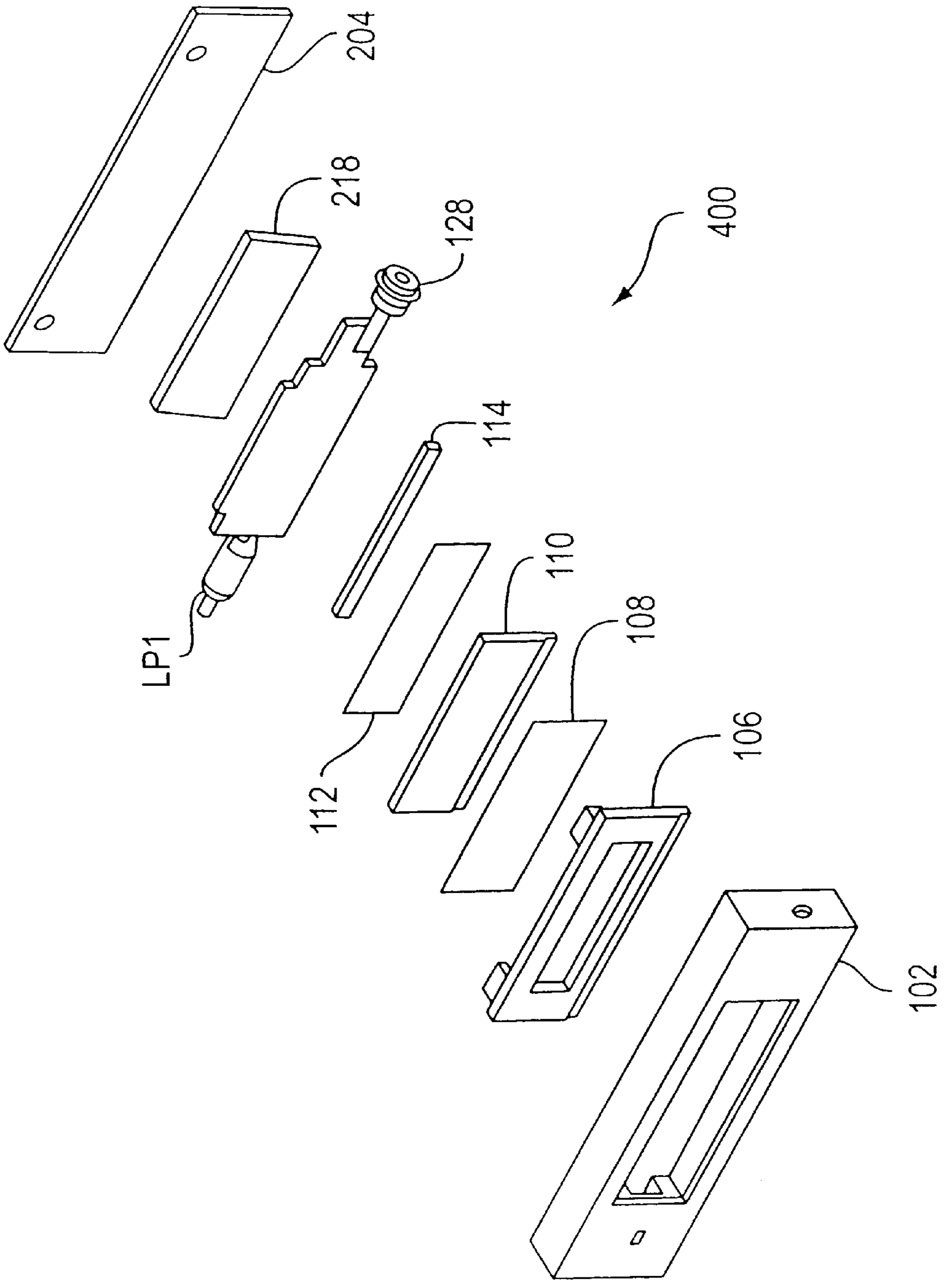
FIG. 9 is a diagram showing one embodiment of a workbench electrostatic dissipater in accordance with the present invention.
Figure 11:
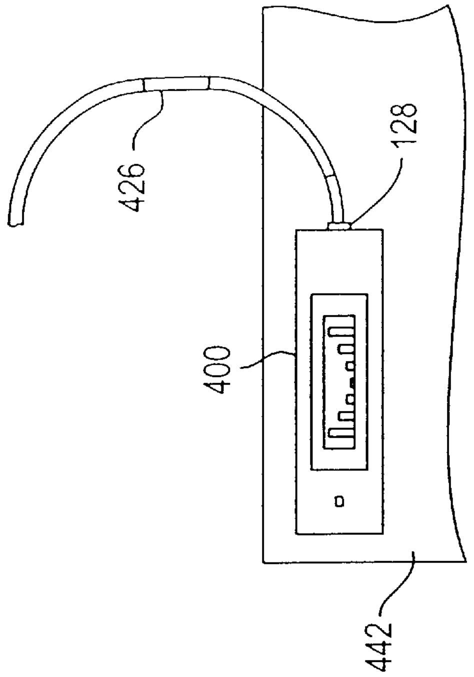
FIG. 11 is a diagram showing a close-up view of a portion of the embodiment shown in FIG. 10.
Figure 10:
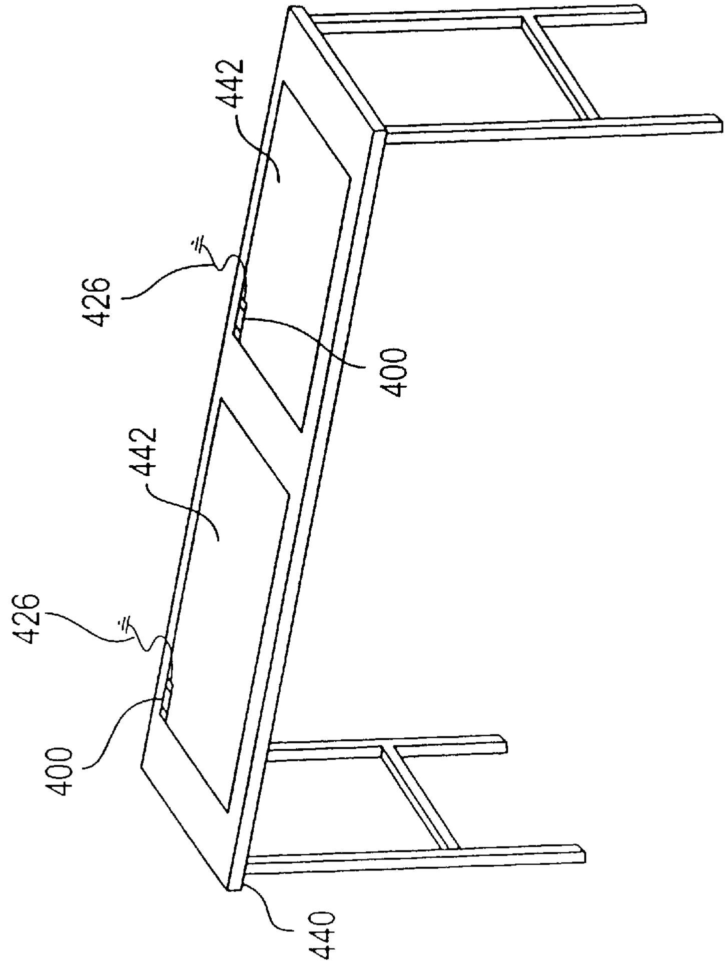
FIG. 10 is a diagram showing one embodiment of the workbench electrostatic dissipater shown in FIG. 9 attached to a workbench.

As shown in FIGS. 9–11, a preferred embodiment of a workbench electrostatic dissipater in accordance with the present invention is designated generally by the reference character 400. As shown in FIGS. 110 and 111, this embodiment includes the workbench electrostatic dissipater 400, a workbench 440, a conductive matting 442, and a ground wire 426.

As shown in FIG. 9, the workbench electrostatic dissipater 400 is similar to the retrofit electrostatic dissipater 200 shown in FIG. 3. One of the differences is the preferred means of fastening the dissipater. The retrofit electrostatic dissipater 200 is preferably fastened to the monitor using studs (not shown) that insert into the front housing cover 102. The workbench electrostatic dissipater 400 is preferably fastened to the workbench mat 442 by pan head screws (not shown) which insert into the front housing cover 102.

The workbench electrostatic dissipater 400 is fastened to the conductive mat 442 using an adhesive, Velcro, or other fastener. Preferably, a conductive fastener is used, although a non-conductive fastener may be used. If a non-conductive fastener is used, performance may be increased by coating the fastener with a conductive electrostatic solution.

An electrostatic charge is conducted from the conductive mat 442 into the rear housing cover 104 through the fastener, and into front housing cover 102 through the air. The electrostatic charge is input to the circuit board assembly 116 through the terminal IN which is electrically coupled to the front housing cover 102 and the rear housing cover 104. The circuit board assembly 116 displays and dissipates the electrostatic charge, conducting the electrostatic charge to a reference ground through the ground wire 426 which is electrically coupled to the AUXGND terminal through the OUTPUT terminal (not shown) of the input/output jack 128.

Although not shown, the electrostatic charge from another source may be dissipated using an additional wire electrically coupled to the INPUT terminal of the input/output jack 128 such that it is electrically coupled to the terminal AUXIN. This permits electrostatic dissipation from electronic equipment on the workbench 440. Further, an electrostatic charge may be dissipated from a user by the user touching the front housing cover 102.

5. Telephone Electrostatic Dissipater

Figure 13:
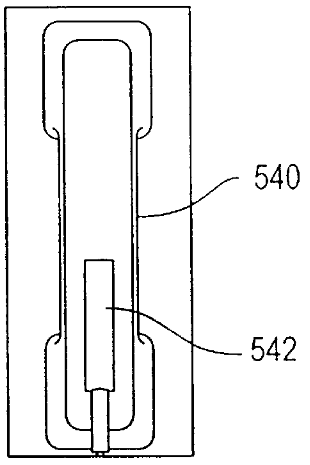
FIG. 13 is a diagram showing a close-up view of one embodiment of the telephone electrostatic dissipater shown in FIG. 12 attached to a handset in accordance with the present invention.
Figure 12:
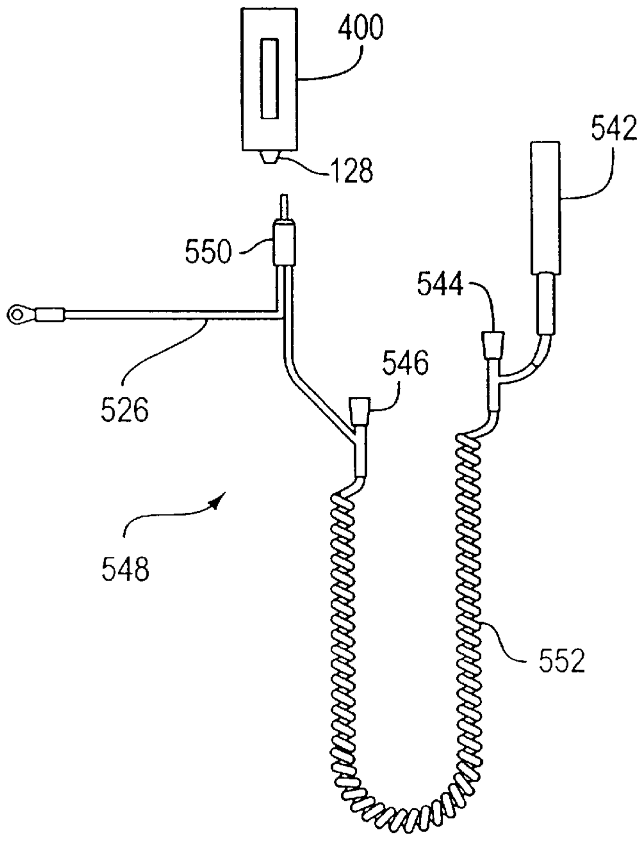
FIG. 12 is a diagram showing one embodiment of a telephone electrostatic dissipater in accordance with the present invention.

As shown in FIGS. 12–13, a preferred embodiment of a telephone electrostatic dissipater in accordance with the present invention is shown. As shown, this embodiment includes an electrostatic dissipater 400 as shown in FIG. 9, a cord assembly 548, and a handset 540.

The cord assembly 548 includes a jack 550, a ground wire 526, telephone jacks 544 and 546, a curly cord 552, and a conductive strip 542. The conductive strip 542 is fastened to the handset 540 using an adhesive or other conductive fastener. The telephone jack 544 is connected to the handset 540, and the telephone jack 546 is connected to the base of the telephone set (not shown). The curly cord 552 is coated with a conductive material.

An electrostatic charge from a user of the telephone is conducted from the user to the handset 540, from the handset 540 to the conductive strip 542, from the conductive strip 542 to the curly cord 552, and from the curly cord 552 to a terminal of jack 550, and from jack 550 to the INPUT terminal (not shown) of the input/output jack 128 which is electrically coupled to the AUXIN terminal of the circuit board assembly 116. The circuit board assembly 116 then displays the electrostatic charge and dissipates the electrostatic charge to a reference ground through the ground wire 526 which is electrically coupled to the AUXGND terminal through a terminal of jack 550 and OUTPUT terminal (not shown) of the input/output jack 128.

Figure 16:
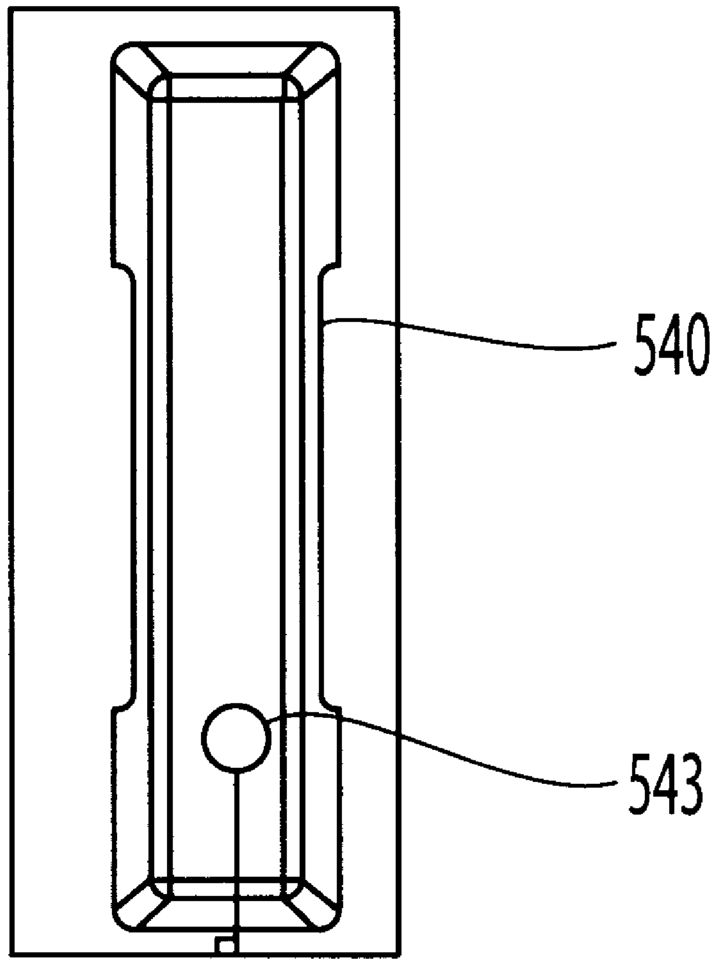
FIG. 16 is a diagram showing another embodiment of a telephone electrostatic dissipater in accordance with the present invention.
Figure 17:
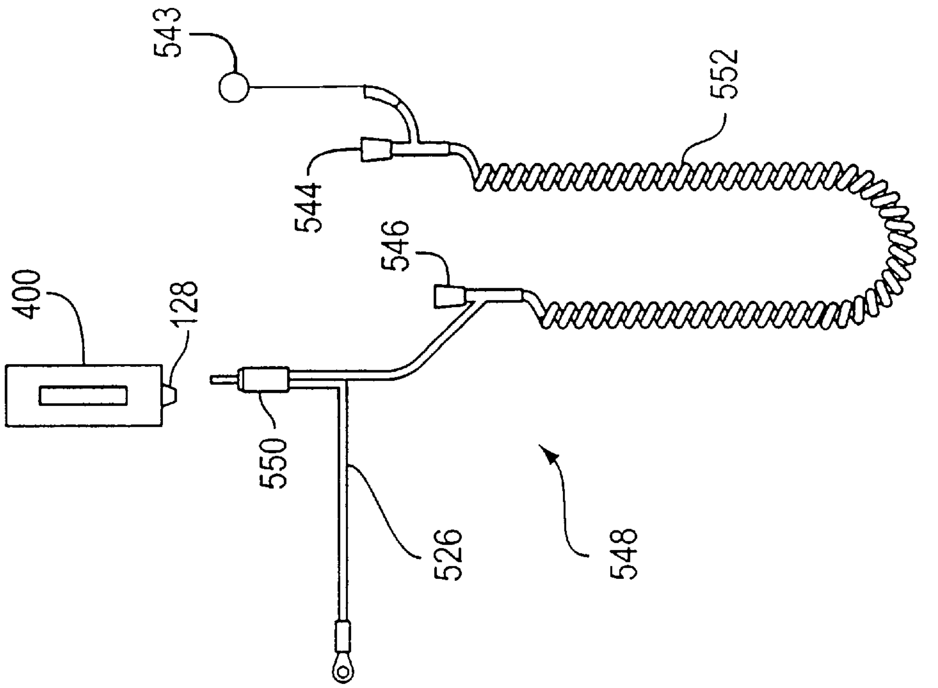
FIG. 17 is a diagram showing a close-up view of the another embodiment of the telephone electrostatic dissipater shown in FIG. 16 attached to a handset in accordance with the present invention.

The embodiment shown in FIG. 12 shows the telephone electrostatic dissipater 400 electrically coupled to a telephone handset 540. However, as is illustrated in FIGS. 16–17, the electrostatic dissipater 400 may similarly be electrically coupled to a telephone headset where a conductive foam pad (543) on the telephone headset is used in place of the conductive strip 542.

In addition to dissipating an electrostatic charge from the handset 540, an electrostatic charge may also be dissipated from a person by the person touching the front housing cover 102.

6. Other Embodiments

The above embodiments of the present invention are provided as examples of the preferred embodiment of the present invention, and the scope of the invention should not be limited to such embodiments. For example, the circuit board assembly 116 with the voltage-overload circuit 150 may be used without an LCD assembly or conductive housing. Such an embodiment would permit further reduction in size of the electrostatic dissipater which could be electrically coupled between a door handle and a reference ground to control the electrostatic event that occurs when a user comes in contact with the door handle.

What is claimed is:

1. An apparatus for dissipating an electrostatic charge from an object comprising:

a first terminal electrically coupled to the object;

a second terminal electrically coupled to a reference ground;

a voltage-overload circuit electrically coupled to the first terminal and the second terminal; and a display coupled between the first terminal and the second terminal that indicates the level of electrostatic charge dissipated.

2. The apparatus of claim 1, wherein:

the voltage-overload circuit comprises at least one of a semi-conductive housing or a neon gas lamp.

3. The apparatus of claim 2, wherein:

the semi-conductive housing comprises a plastic with a conductive filler.

4. The apparatus of claim 3, wherein:

the conductive filler is at least one of a carbon filler or a stainless steel filler.

5. The apparatus of claim 3, wherein:

the conductive filler is at least one of a fiber filler or a powder filler.

6. The apparatus of claim 1, further comprising:

a plurality of surface mount resistors electrically coupled between the first terminal and the second terminal.

7. The apparatus of claim 1, wherein:

the display indicates when an electrostatic charge is dissipated.

8. The apparatus of claim 1, further comprising:

means for varying the level of electrostatic charge that is indicated on the display.

9. The apparatus of claim 1, further comprising:

a conductive electrostatic coating on the surface of the object.

10. The apparatus of claim 1, wherein:

the object is at least one of a computer monitor, a television, a keyboard, a computer mouse, a palm rest, a person, a workbench, a workbench mat, electrical equipment, a telephone handset, or a telephone headset.

11. The apparatus of claim 1, further comprising:

an input/output jack, wherein the jack includes:

a jack input terminal electrically coupled between the first terminal and the object, and a jack output terminal electrically coupled between the second terminal and the reference ground.

12. The apparatus of claim 11, further comprising:

a telephone cord with a conductive coating, the telephone cord having one end electrically coupled to the jack input terminal;

a conductive strip attached to a telephone handset, the conductive strip being electrically coupled between the telephone handset and the other end of the telephone cord.

13. The apparatus of claim 11, further comprising:

a telephone headset, the telephone headset including a conductive foam pad; and wherein the conductive foam pad is electrically coupled to the jack input terminal.

14. The apparatus of claim 1, further comprising:

a wire electrically coupled to the second terminal; and a conductive foam pad electrically coupled between the wire and the object.

15. The apparatus of claim 1, further comprising:

a wire electrically coupled between the second terminal and the reference ground; and wherein, the reference ground is an electrical ground of the object.

16. The apparatus of claim 1, wherein:

the voltage-overload circuit includes a neon gas lamp.

17. An apparatus for dissipating an electrostatic charge from an object comprising:

a first terminal electrically coupled to the object;

a second terminal electrically coupled to a reference ground; circuit hardening means, electrically coupled to the first terminal and the second terminal, for providing voltage overload protection from an electrostatic event; and display means, electrically coupled between the first terminal and the second terminal, for displaying the level of electrostatic charge dissipated.

18. The apparatus of claim 17, wherein:

the hardening means comprises at least one of a semi-conductive housing or a neon gas lamp.

19. The apparatus of claim 18, wherein:

the semi-conductive housing comprises a plastic with a conductive filler.

20. The apparatus of claim 19, wherein:

the conductive filler is at least one of a carbon filler or a stainless steel filler.

21. The apparatus of claim 19, wherein:

the conductive filler is at least one of a fiber filler or a powder filler.

22. The apparatus of claim 19, further comprising:

a plurality of surface mount resistors electrically coupled between the first terminal and the second terminal.

23. The apparatus of claim 17, further comprising:

level varying means for varying the level of electrostatic charge that is indicated on the display means.

24. The apparatus of claim 17, further comprising:

coating means for conducting an electrostatic charge on the surface of the object.

25. The apparatus of claim 17, wherein:

the object is at least one of a computer monitor, a television, a keyboard, a computer mouse, a palm rest, a person, a workbench, a workbench mat, electrical equipment, a telephone handset, or a telephone headset.

26. The apparatus of claim 17, further comprising:

input/output means for electrically coupling the first terminal to the object, and for electrically coupling the second terminal to the reference ground.

27. The apparatus of claim 26, further comprising:

a telephone cord with a conductive coating, the telephone cord having one end electrically coupled to the first terminal by the input/output means;

a conductive strip attached to a telephone handset, the conductive strip being electrically coupled between telephone handset and the other end of the telephone cord.

28. The apparatus of claim 26, further comprising:

a telephone headset, the telephone headset including a conductive foam pad; and wherein the conductive foam pad is electrically coupled to the first terminal by the input/output means.

29. The apparatus of claim 17, further comprising:

means for electrically coupling the second terminal to the object.

30. An apparatus for dissipating an electrostatic charge from an object, comprising:

a dissipating circuit coupled to the object; and a display coupled to the dissipating circuit, the display being operable to display a level of electrostatic charge being dissipated by the dissipating circuit from the object.

31. The apparatus of claim 30, further comprising:

means for varying the level of electrostatic charge that is indicated on the display.

32. The apparatus of claim 30, wherein:

the display is a liquid crystal display.

33. An apparatus for dissipating an electrostatic charge from an object, comprising:

a dissipating circuit coupled to the object; and display means coupled to the dissipating circuit for displaying a level of electrostatic charge being dissipated from the object.

34. The apparatus of claim 33, further comprising:

means for varying the level of electrostatic charge that is indicated on the display means.

35. The apparatus of claim 33, wherein:

the display means includes a liquid crystal display.

36. An apparatus for dissipating an electrostatic charge from an object, comprising:

a housing;

a fastener for attaching the housing to a ground object, the ground object being electrically coupled to a reference ground and electrically insulated from the housing;

a conductive element, the element being electrically coupled to the ground object and electrically insulated from the housing;

a first terminal electrically coupled to the housing;

a second terminal electrically coupled to the conductive element;

a dissipating circuit electrically coupled to the first terminal and the second terminal, the circuit being operable to control dissipation of an electrostatic charge from the first terminal to the second terminal; and a display being operable to display a level of electrostatic charge being dissipated by the dissipating circuit.

37. The apparatus of claim 36, wherein the dissipating circuit comprises:

a voltage-overload circuit electrically coupled to the first terminal and the second terminal.

38. The apparatus of claim 37, wherein the voltage-overload circuit comprises:

a neon gas lamp.

39. The apparatus of claim 36, wherein the dissipating circuit comprises:

a plurality of resistors.

40. The apparatus of 39, wherein:

the plurality of resistors are surface mount resistors.

41. The apparatus of claim 36, further comprising:

an input/output jack, the input/output jack comprising an input terminal electrically coupled to the first terminal, and an output terminal electrically coupled to the second terminal.

42. The apparatus of claim 36, wherein:

the housing comprises a plastic with a conductive filler.

43. The apparatus of claim 42, wherein:

the conductive filler is at least one of a carbon filler or a stainless steel filler.

44. The apparatus of claim 42, wherein:

the conductive filler is at least one of a fiber filler or a powder filler.

45. The apparatus of claim 36, wherein:

the display is a liquid crystal display.

46. The apparatus of claim 36, further comprising:

means for varying the level of electrostatic charge that is indicated on the display.

47. The apparatus of claim 36, further comprising: a conductive electrostatic coating on the surface of the object.

48. An apparatus for dissipating an electrostatic charge from an object, comprising:

a housing;

a fastener for attaching the housing to the object;

an electrical jack, the electrical jack comprising an output terminal;

a first terminal electrically coupled to the housing;

a second terminal electrically coupled to the output terminal;

a dissipating circuit electrically coupled to the first terminal and the second terminal, the circuit being operable to control dissipation of an electrostatic charge from the first terminal to the second terminal; and a display being operable to display a level of electrostatic charge being dissipated by the dissipating circuit.

49. The apparatus of claim 48, wherein:

the dissipating circuit comprises a voltage-overload circuit electrically coupled between the first terminal and the second terminal.

50. The apparatus of claim 49, wherein:

the voltage-overload circuit comprises at least one of a semi-conductive housing material or a neon gas lamp.

51. The apparatus of claim 48, wherein:

the housing comprises a plastic with a conductive filler.

52. The apparatus of claim 51, wherein:

the conductive filler is at least one of a carbon filler or a stainless steel filler.

53. The apparatus of claim 51, wherein:

the conductive filler is at least one of a fiber filler or a powder filler.

54. The apparatus of claim 48, wherein:

the display is a liquid crystal display.

55. The apparatus of claim 48, further comprising:

a conductive electrostatic coating on the surface of the object.

56. An apparatus for dissipating an electrostatic charge from an object, comprising:

a housing;

a fastener for attaching the housing to the object;

a ground wire, the ground wire being electrically coupled to a reference ground of the object;

a first terminal electrically coupled to the housing;

a second terminal electrically coupled to the ground wire;

a dissipating circuit electrically coupled to the first terminal and the second terminal, the circuit being operable to control dissipation of an electrostatic charge from the first terminal to the second terminal; and a display being operable to display a level of electrostatic charge being dissipated by the dissipating circuit.

57. The apparatus of claim 56, wherein:

the dissipating circuit comprises a voltage-overload circuit electrically coupled between the first terminal and the second terminal.

58. The apparatus of claim 57, wherein:

the voltage-overload circuit comprises at least one of a semi-conductive housing material or a neon gas lamp.

59. The apparatus of claim 56, wherein:

the dissipating circuit comprises a plurality of surface mount resistors.

60. The apparatus of claim 56, further comprising:

an input/output jack, the input/output jack including a jack input terminal electrically coupled to the first terminal, and a jack output terminal electrically coupled to the second terminal.

61. The apparatus of claim 56, wherein:

the housing comprises a plastic with a conductive filler.

62. The apparatus of claim 61, wherein:

the conductive filler is stainless steel.

63. The apparatus of claim 61, wherein:

the conductive filler is a fiber filler.

64. The apparatus of claim 56, wherein:

the display is a liquid crystal display.

65. The apparatus of claim 56, further comprising:

a conductive electrostatic coating on the surface of the object.

66. An apparatus for dissipating an electrostatic charge from an object, comprising:

a housing;

an input/output jack, the input/output jack comprising an input terminal electrically coupled to the object and an output terminal electrically coupled to a reference ground;

a first terminal electrically coupled to the input terminal and to the housing;

a second terminal electrically coupled to the output terminal;

a dissipating circuit electrically coupled to the first terminal and the second terminal, the circuit being operable to control dissipation of an electrostatic charge from the first terminal to the second terminal; and a display being operable to display a level of electrostatic charge being dissipated by the dissipating circuit.

67. The apparatus of claim 66, wherein:

the dissipating circuit includes a voltage-overload circuit electrically coupled to the first terminal and the second terminal.

68. The apparatus of claim 67, wherein:

the voltage-overload circuit includes a neon gas lamp.

69. The apparatus of claim 66, wherein:

the dissipating circuit includes a plurality of surface mount resistors.

70. The apparatus of claim 66, wherein: the housing comprises a plastic with a conductive filler.

71. The apparatus of claim 70, wherein:

the conductive filler is steel.

72. The apparatus of claim 70, wherein:

the conductive filler is a fiber filler.

73. The apparatus of claim 66, wherein:

the display is a liquid crystal display.

74. The apparatus of claim 66, further comprising:

varying means for varying the level of electrostatic charge that is indicated on the display.

75. The apparatus of claim 66, further comprising:

a conductive electrostatic coating on the surface of the object.

76. The apparatus of claim 66, further comprising:

a telephone cord with a conductive coating, the telephone cord having one end electrically coupled to the jack input terminal;

a conductive strip attached to a telephone handset, the conductive strip being electrically coupled between the telephone handset and the other end of the telephone cord.

77. The apparatus of claim 66, further comprising:

a telephone headset, the telephone headset including a conductive foam pad that is electrically coupled to the jack input terminal.

78. A method for evaluating the electrostatic charge associated with an object, comprising:

electrically coupling the object to a first terminal of an electrostatic dissipater, the electrostatic dissipater being operable to display a level of electrostatic charge being dissipated;

electrically coupling a reference ground to a second terminal of the electrostatic dissipater; and observing a display of the electrostatic dissipater.

79. A method of dissipating electrostatic charge from an object comprising:

coating the surface of the object with a conductive electrostatic solution;

electrically coupling the object to an electrostatic dissipater; and displaying on a display an indication that is proportional to the level of electrostatic charge being dissipated by the electrostatic dissipater.

80. A method of displaying the level of electrostatic charge associated with an object, comprising:

electrically coupling the object to a first terminal of an electrostatic dissipater, the electrostatic dissipater being operable to display a level of electrostatic charge being dissipated;

electrically coupling a reference ground to a second terminal of the electrostatic dissipater; and displaying on a display an indication which is proportional to the level of electrostatic charge being dissipated between the first terminal and the second terminal.

81. The method of claim 80, wherein:

the display is a liquid crystal display.

82. The method of claim 80, wherein:

the electrostatic dissipater includes circuit hardening means for providing voltage-overload protection from an electrostatic event.

83. The method of claim 82, wherein:

the hardening means includes a neon gas lamp.

84. The method of claim 82, wherein:

the hardening means includes a semi-conductive housing.

85. The method of claim 84, wherein:

the semi-conductive housing comprises a plastic and a conductive filler.

* * * * *